(12) United States Patent
Ishikawa et al.

(10) Patent No.: US 7,746,957 B2
(45) Date of Patent: Jun. 29, 2010

(54) DISTORTION CORRECTION CONTROL APPARATUS AND DISTORTION CORRECTION CONTROL METHOD

(75) Inventors: Hiroyoshi Ishikawa, Kawasaki (JP); Kazuo Nagatani, Kawasaki (JP); Hajime Hamada, Kawasaki (JP); Nobukazu Fudaba, Kawasaki (JP); Yuichi Utsunomiya, Kawasaki (JP); Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/567,431

(22) Filed: Sep. 25, 2009

(65) Prior Publication Data

US 2010/0014609 A1 Jan. 21, 2010

Related U.S. Application Data

(63) Continuation of application No. PCT/JP2007/056663, filed on Mar. 28, 2007.

(51) Int. Cl.
*H04L 25/49* (2006.01)
*H03C 3/08* (2006.01)

(52) U.S. Cl. ........................ 375/296; 332/124

(58) Field of Classification Search ............ 375/285, 375/295, 296, 297; 455/114.2, 114.3, 91; 332/106, 107, 123, 124, 159, 160
See application file for complete search history.

(56) References Cited

U.S. PATENT DOCUMENTS

| 5,870,668 A | 2/1999 | Takano |
| 5,903,823 A | 5/1999 | Moriyama |
| 6,081,698 A | 6/2000 | Moriyama |
| 6,091,941 A | 7/2000 | Moriyama |
| 7,447,274 B2 * | 11/2008 | Shako et al. ............ 375/296 |
| 7,466,762 B2 * | 12/2008 | Shako et al. ............ 375/296 |
| 7,486,744 B2 * | 2/2009 | Shako et al. ............ 375/296 |
| 7,613,251 B2 * | 11/2009 | Shako et al. ............ 375/296 |
| 2005/0104758 A1 | 5/2005 | Funyu |

FOREIGN PATENT DOCUMENTS

JP 04301950 10/1992

(Continued)

OTHER PUBLICATIONS

International Search Report dated May 15, 2007 received in corresponding PCT/JP2007/056663.

*Primary Examiner*—Tesfaldet Bocure
(74) *Attorney, Agent, or Firm*—Hanify & King, PC

(57) ABSTRACT

A distortion correction control apparatus is for compensating for a burst distortion in a transmission amplifier caused by a burst of an input signal of a transmission target. The apparatus includes a holding unit that stores a distortion correction coefficient having reverse characteristics to the burst distortion; a unit that multiplies the distortion correction coefficient read out from the holding unit by the input signal or adds the distortion correction coefficient read out from the holding unit to the input signal, upon reception of burst information notifying of switching between presence and absence of the input signal; and an update unit that updates, based on the input signal, the distortion correction coefficient of the last time, and a signal fed back as an output signal of the transmission amplifier, the distortion correction coefficient by an adaptive algorithm, and that inputs the updated distortion correction coefficient to the holding unit.

10 Claims, 8 Drawing Sheets

FOREIGN PATENT DOCUMENTS

| | | |
|---|---|---|
| JP | 09153849 | 6/1997 |
| JP | 2004112252 | 4/2004 |
| JP | 2004187218 | 7/2004 |
| JP | 3560398 | 9/2004 |
| JP | 2005151119 | 6/2005 |
| JP | 2005269043 | 9/2005 |

* cited by examiner

DISTORTION CORRECTION CONTROL APPARATUS AND DISTORTION CORRECTION CONTROL METHOD

CROSS-REFERENCE TO RELATED APPLICATION

This is a continuation of application PCT/JP2007/056663, filed on Mar. 28, 2007, now pending, the contents of which are herein wholly incorporated by reference.

FIELD

The disclosures made herein relate to a distortion correction control apparatus and a distortion correction control method which are to be applied to a wireless communication system.

BACKGROUND

In a wireless communication system that employs a wireless transmission system such as orthogonal frequency division multiplexing (OFDM), signals of burst characteristics are often processed.

In general, an amplifier has amplifier operation points set to AB to B grades to improve power efficiency. Thus, the amount of current flowing to the amplifier during a no-signal period (during a burst-OFF period) is small. When a signal is suddenly input (burst ON) from the burst-OFF period, a current rapidly flows to an amplifier power source system. The power source system cannot follow such a sudden change in current value, causing current and voltage waveforms to exhibit transient responses (refer to FIG. 1). As a result, amplifier characteristics change.

As a related art of the present invention, techniques disclosed in the following two Patent Documents may be cited. First, Japanese Patent Application Laid-Open No. 2004-112252 (Patent Document 1) discloses a technique of adjusting an amplifier input signal to correct an amplifier distortion caused by burst transmission. This technique is characterized by measuring leading and trailing of a burst signal during transmission and performing a burst correction operation according to the leading and trailing thus measured.

Second, Japanese Patent Application Laid-Open No. H04-301950 (Patent Document 2) discloses a technique of restraining sudden rising to suppress burst distortion. This technique is characterized by suppressing the occurrence of burst distortion itself via ramp processing to gradually increase transmission outputs.

According to the technique described in Patent Document 1, a built-in correction coefficient is used, which does not follow the changes in amplifier characteristics. Because the amplifier undergoes changes in its characteristics due to a temperature or a passage of time, the amplifier has to maintain correction accuracy of burst distortion by adaptively updating the correction coefficient.

According to the technique described in Patent Document 2, a ramp operation is performed, which suppresses sudden rising of a transmission signal to gradually increase outputs. In this technique, a signal rising period has to be provided before burst-ON or a signal has to be gradually raised after burst-ON, which causes deformation of a waveform of an amplifier output signal.

The following are related arts to the invention.

[Patent document 1] Japanese Patent Laid-Open Publication No. JP 2004-112252

[Patent document 2] Japanese Patent Laid-Open Publication No. JP H04-301950

[Patent document 3] Japanese Patent Laid-Open Publication No. JP H09-153849

[Patent document 4] Japanese Patent No. JP 3560398

SUMMARY

According to an aspect of the disclosures made herein, a distortion correction control apparatus is for compensating for a burst distortion in a transmission amplifier caused by a burst of an input signal of a transmission target. The apparatus includes a holding unit that stores a distortion correction coefficient having reverse characteristics to the burst distortion; a unit that multiplies the distortion correction coefficient read out from the holding unit by the input signal or adds the distortion correction coefficient read out from the holding unit to the input signal, upon reception of burst information notifying of switching between presence and absence of the input signal; and an update unit that updates, based on the input signal, the distortion correction coefficient of the last time, and a signal fed back as an output signal of the transmission amplifier, the distortion correction coefficient by an adaptive algorithm, and that inputs the updated distortion correction coefficient to the holding unit.

The objects and advantages of the invention will be realized and attained by means of the elements and combinations particularly pointed out in the claims.

DESCRIPTION OF EMBODIMENTS

Figure 1:
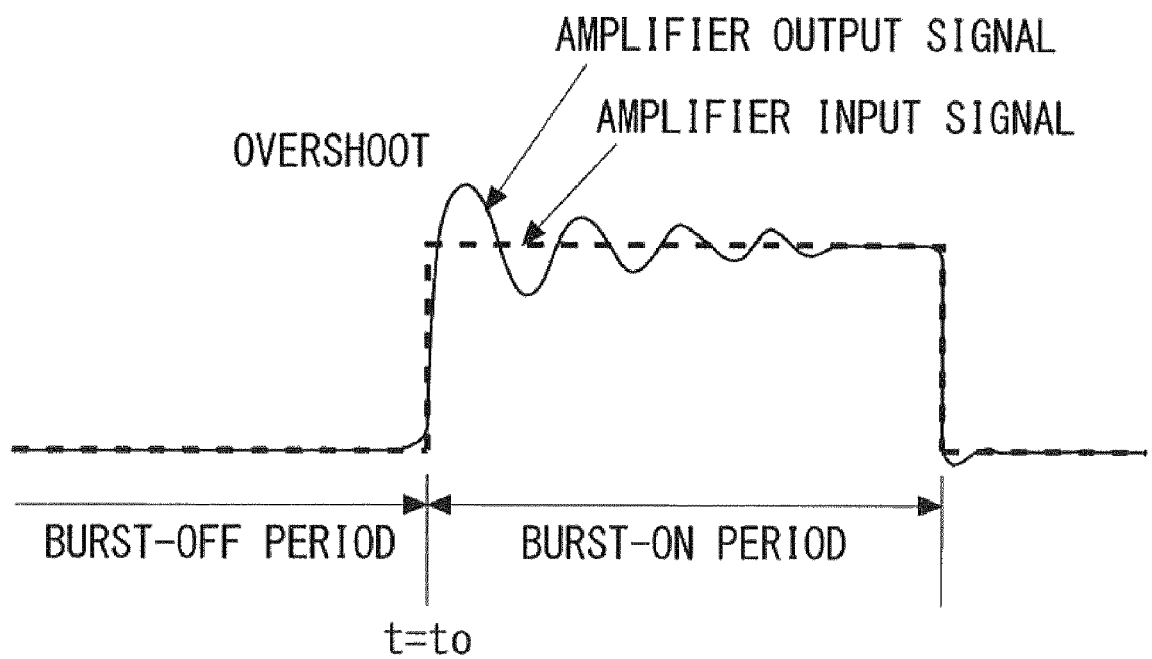
FIG. 1 a diagram illustrating input and output signals in a transmission amplifier during burst transmission.

The embodiments of the disclosures made herein will be described below referring to the drawings in detail. The drawings illustrate preferred embodiments. It should be understood, however, that the embodiments can be implemented by many different embodiments, and are not limited to the embodiments described herein.

First Embodiment

Figure 2:
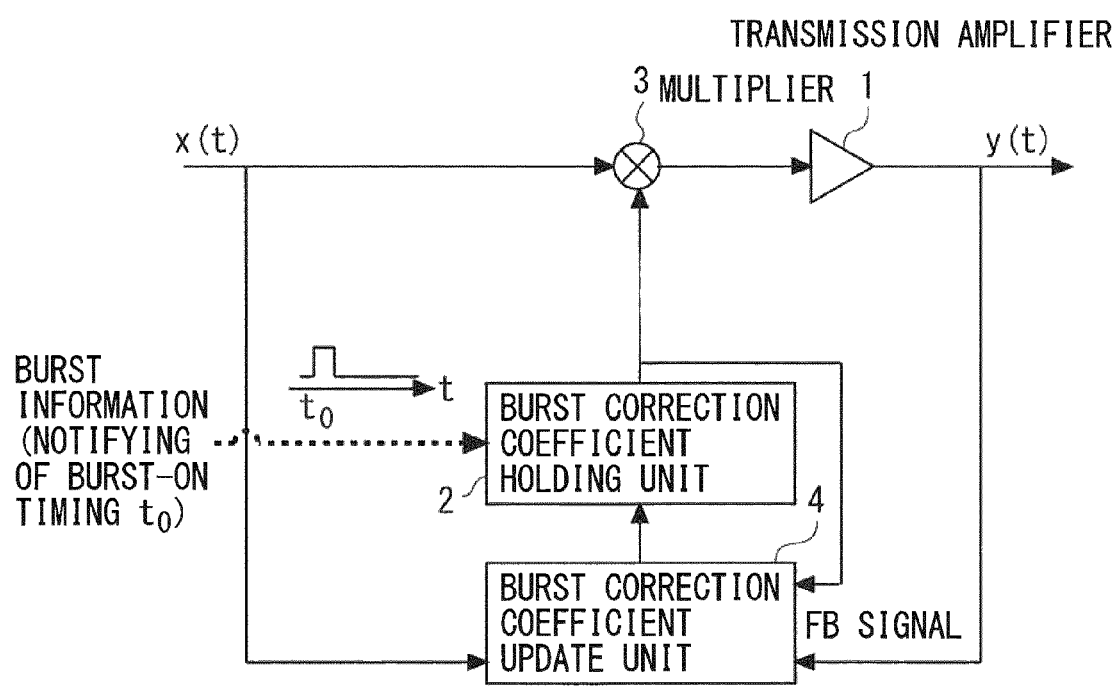
FIG. 2 is a block diagram illustrating a burst distortion correction control apparatus according to a first embodiment of the present invention.

Referring to FIG. 2 illustrating a configuration (basic configuration) of a first embodiment of the present invention, a burst distortion correction control apparatus employs, to correct an amplifier distortion (burst distortion) caused by burst characteristics of an input signal x(t) of a transmission target, a configuration in which the input signal x(t) to a transmission amplifier (RF amplifier) 1 is multiplied by (or may be added to) a correction coefficient.

The correction coefficient (burst distortion correction coefficient) is read out from a burst correction coefficient holding unit 2 by using burst information that is a signal (signal notifying of timing of burst (start) ON) notifying of switching between presence and absence of an input signal as a reference (opportunity), and the input signal x(t) is multiplied by the correction coefficient as reverse characteristics to the burst distortion by a multiplier 3.

In a burst correction coefficient update unit 4, a burst distortion correction coefficient is updated based on an input signal x(t), a correction coefficient of the last time (one point back in time), and a branch signal y(t), by an adaptive algorithm. The branch signal (FB signal) y(t) is a signal obtained as partial feedback of an output signal y(t) from the transmission amplifier 1, and is equivalent to the output signal y(t).

The burst correction coefficient update unit 4 inputs the updated correction coefficient to the burst correction coefficient holding unit 2 to store the updated correction coefficient.

The burst distortion correction control apparatus executes digital signal processing, and therefore includes a digital/analog (D/A) converter disposed on an input side (front stage) to the transmission amplifier 1 and an analog/digital (A/D) converter disposed on a reception line (rear stage) of a branch signal y(t) of an output side of the transmission amplifier 1. However, these components are not shown. Unless specified otherwise, drawings of these components are omitted in the other embodiments.

In the front and rear stages of the transmission amplifier 1, a quadrature modulator, a quadrature demodulator, and a local oscillator are disposed. However, drawings of these components are omitted for simpler description.

Next, two types of methods that enable the burst correction coefficient generation unit 2 to obtain burst information as a signal notifying of burst-ON timing will be described.

Figure 3:
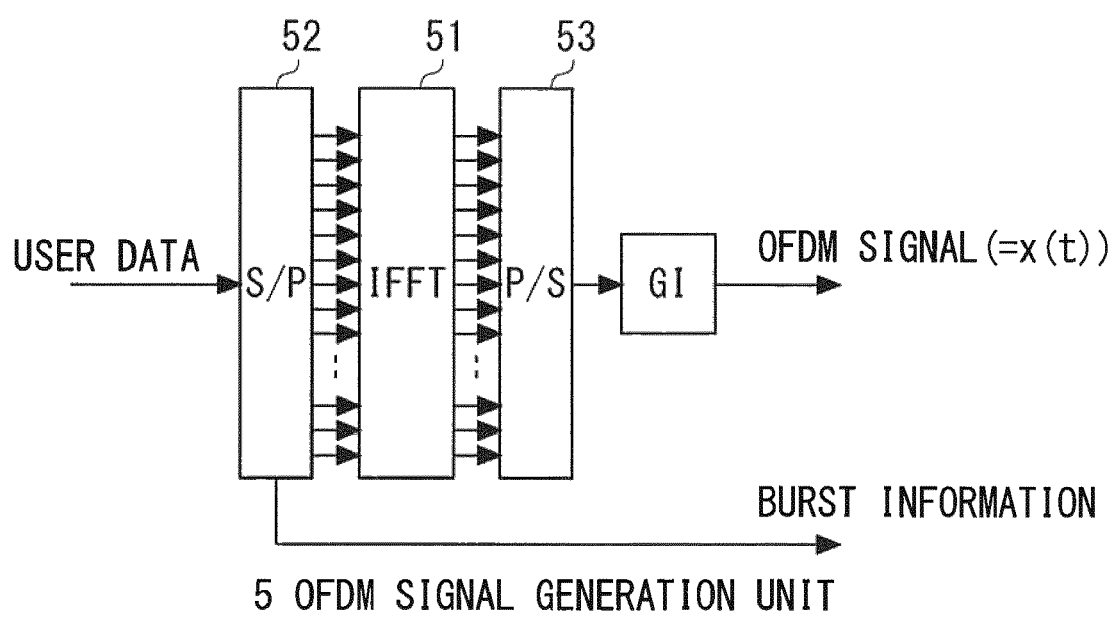
FIG. 3 is a diagram illustrating a first method of obtaining burst information.

The first one of the methods includes a method of snooping burst information from an OFDM signal generation unit 5 shown in FIG. 3. An OFDM signal is generated on a block unit basis using inverse fast Fourier transform (IFFT). A burst occurs in a processing unit of this IFFT. Burst information is obtained by checking whether an input signal to an IFFT processing unit 51 has switched from all "0" to burst-ON, and whether a signal after IFFT processing has switched from all "0" to burst-ON.

Whether the input signal to the IFFT processing unit 51 has switched from all "0" to burst-ON is determined by a serial/parallel (S/P) converter 52 to obtain burst information. This determination may be performed based on an output signal from the IFFT processing unit 51 to obtain burst information.

Figure 4:
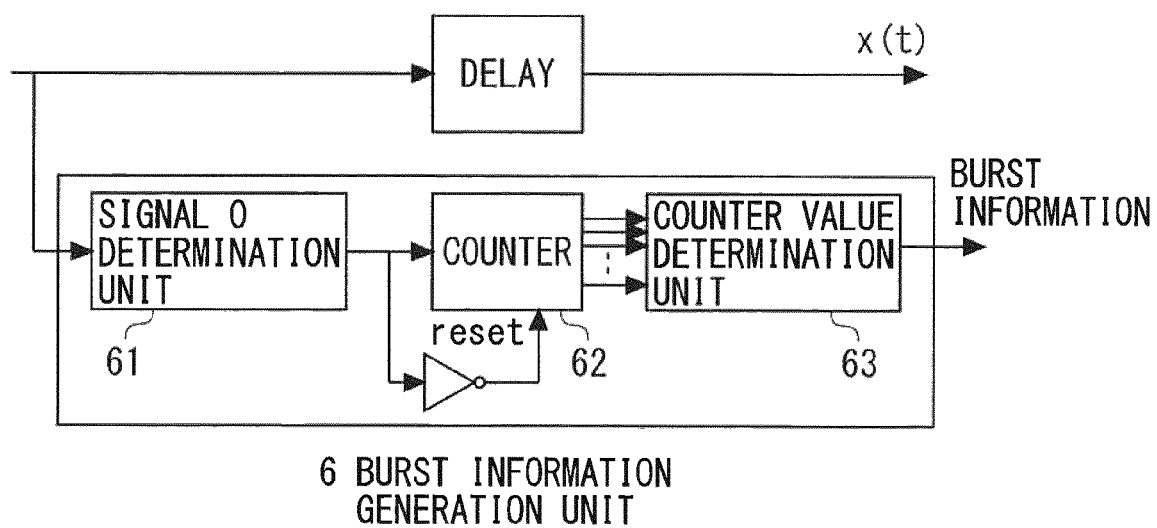
FIG. 4 illustrates a second method of obtaining burst information.

The second one of the methods includes a method of automatically determining whether an input signal x(t) of a transmission target is predetermined time zero and using the input signal x(t) as burst information. FIG. 4 illustrates a specific example of independently generating burst information.

In a burst information generation unit 6, a signal zero determination unit 61 determines whether the input signal x(t) is a zero (0) signal. If the signal is a zero signal, a counter 62 of a rear stage is reset. If the signal is not a zero signal, the counter 62 is counted up.

In a counter value determination unit 63, if a counter value has reached a predetermined value, a pulse of burst information is generated determining that a burst-ON period has been started. In the drawing, there is provided a delay circuit (Delay) for delaying the input signal x(t) by processing time in the burst information generation unit 6.

Second Embodiment

Figure 5:
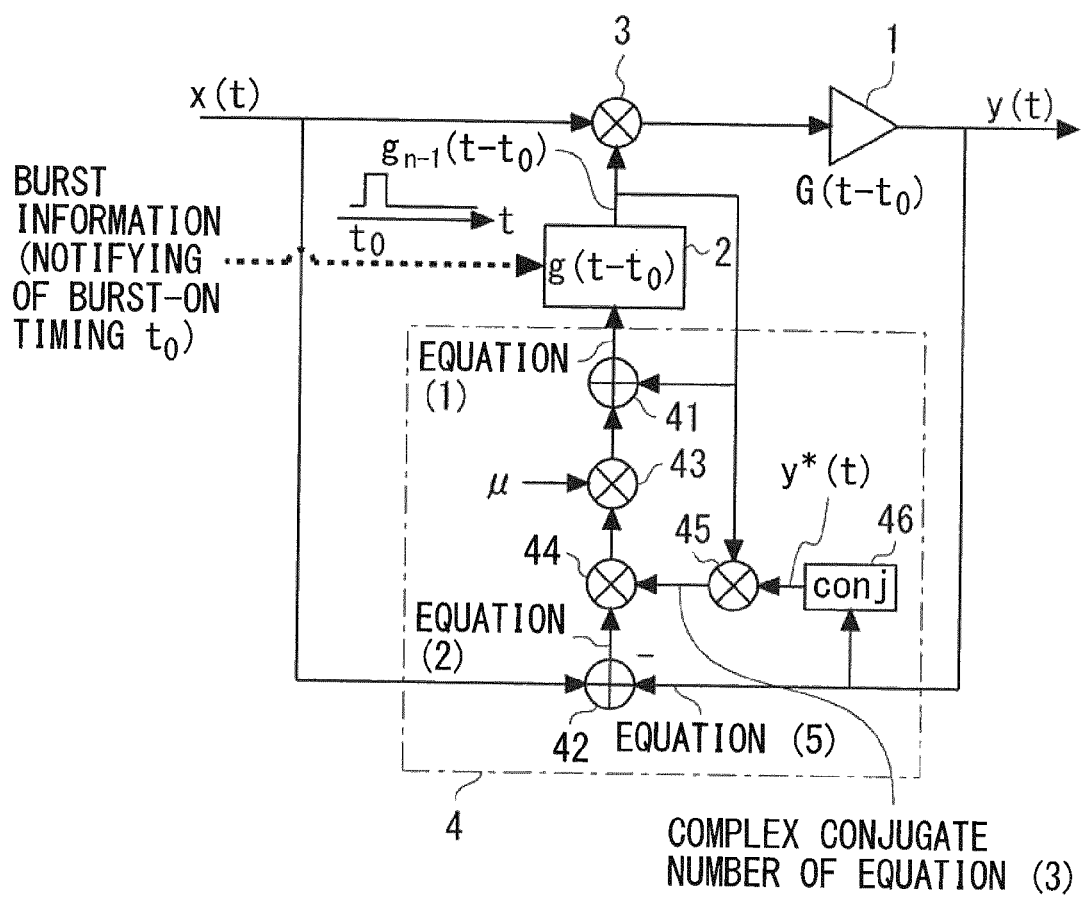
FIG. 5 is a block diagram illustrating a burst distortion correction control apparatus according to a second embodiment of the present invention.

FIG. 5 illustrates a configuration of a burst distortion correction control apparatus according to a second embodiment of the present invention. The second embodiment is a modified example of the basic configuration of the first embodiment shown in FIG. 2.

Referring to FIG. 5, the burst distortion correction control apparatus includes a burst correction coefficient holding unit 2, a multiplier 3, and a burst correction coefficient update unit 4. The burst correction coefficient update unit 4 includes an adder 41, a comparator (subtracter) 42, multipliers 43, 44, and 45, and a complex number conversion circuit (conj) 46. This configuration employs a least square method (LMS) as an adaptive algorithm to generate a correction coefficient for a burst distortion in the transmission amplifier 1.

The burst distortion correction control apparatus employs a configuration where a correction coefficient according to a passage of time from burst-ON ($t_0$) is read from the burst correction coefficient holding unit 2 which stores the correction coefficients for the burst distortion. The input signal x(t) of a transmission target is multiplied by a correction coefficient $g_{n-1}(t-t_0)$ to compensate for a burst distortion $G(t-t_0)$ in the transmission amplifier 1.

Estimation of a burst distortion amount to be compensated for is performed by calculation of Expression 1 including Equations (1) to (5).

[Expression 1]

$$g_n(t-t_0) = g_{n-1}(t-t_0) + \mu e(t-t_0) u^*(t-t_0) \qquad (1)$$

$$e(t-t_0) = x(t) - y(t) \qquad (2)$$

$$u(t-t_0) = x(t) G(t-t_0) \cong g^*_{n-1}(t-t_0) y(t) \qquad (3)$$

$$\because g_{n-1}(t-t_0) g^*_{n-1}(t-t_0) \cong 1 \qquad (4)$$

$$y(t) = g_{n-1}(t-t_0) x(t) G(t-t_0) \qquad (5)$$

In Expression 1, x(t) denotes an input signal (baseband signal), y(t) denotes an output signal of the amplifier 1, $G(t-t_0)$ denotes a burst distortion function of the amplifier 1, $g(t-t_0)$ denotes a distortion compensation coefficient, and $\mu$ denotes a step size parameter. In Expression 1, x, y, G, g, and u denote complex numbers, * denotes a complex conjugate number, and $\mu$ denotes a real number.

Assuming $g_n(t-t_0) g^*_n(t-t_0) \cong 1$ where an amplitude distortion of the burst distortion in the transmission amplifier 1 is not so large, $u(t-t_0)$ is approximately obtained.

In Expression (1), $g_n(t-t_0)$ is an updated burst distortion compensation coefficient. For a branch signal y(t) corresponding to the output signal y(t) of the amplifier 1, complex conjugation is taken to obtain y*(t) in the complex number conversion circuit 46 that generates a complex conjugate number. A burst distortion coefficient of the last time (one point back in time) $g_{n-1}(t-t_0)$ and y*(t) are multiplied together by the multiplier 45 to obtain $u^*(t-t_0)$.

Then, an output $e(t-t_0)$ of the comparator 42 is multiplied by $u^*(t-t_0)$ by the multiplier 44, and further multiplied by a step size parameter by the multiplier 43. An output of the multiplier 43 and the burst distortion compensation coefficient of one point back in time $g_{n-1}(t-t_0)$ are added together by the adder 41 to obtain a new burst distortion correction coefficient $g_n(t-t_0)$.

Third Embodiment

Figure 6:
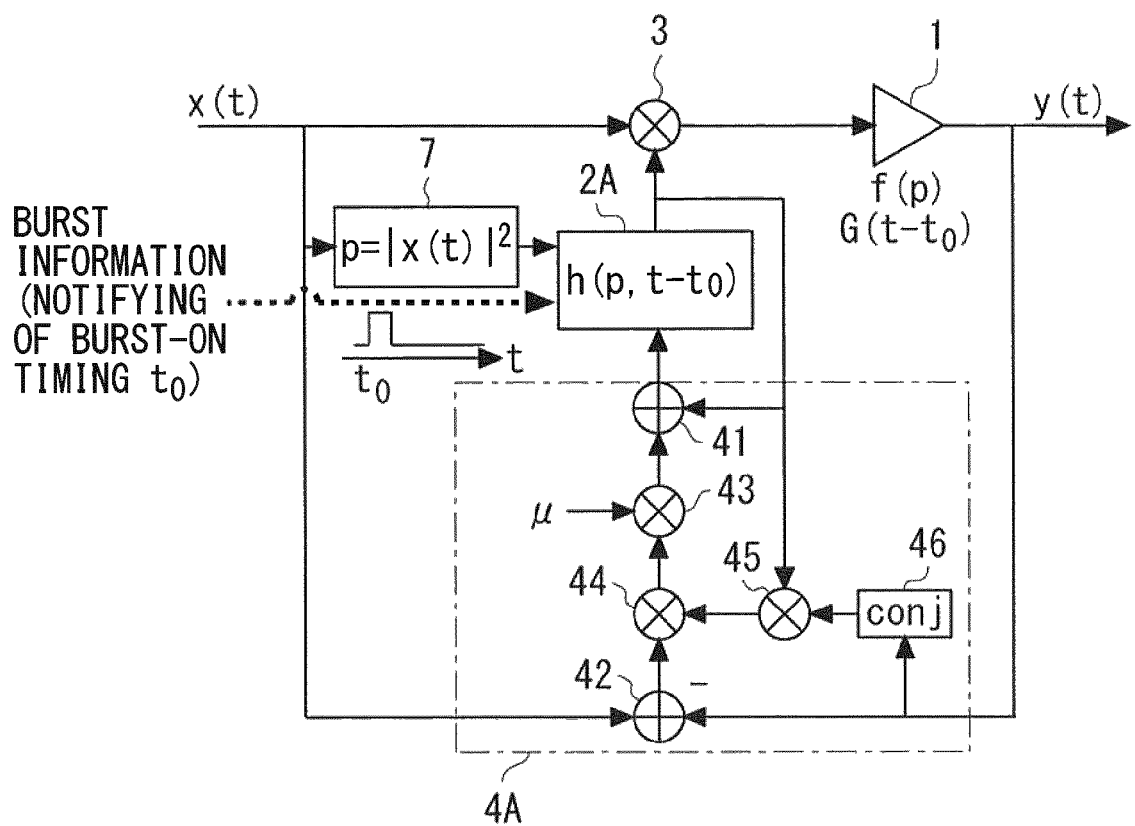
FIG. 6 is a block diagram illustrating a burst distortion correction control apparatus according to a third embodiment of the present invention.

FIG. 6 illustrates a configuration of a burst distortion correction control apparatus according to a third embodiment of the present invention. The third embodiment is another modified example of the basic configuration of the second embodiment shown in FIG. 5.

The burst distortion correction control apparatus of the third embodiment is an example where the burst distortion correction processed by the specific configuration of the second embodiment is combined with digital predistortion (DPD) that is an existing technique of compensating for nonlinear distortion in a transmission amplifier. The DPD is detailed in Patent Document 4 (Japanese Patent No. JP 3560398).

Figure 7:
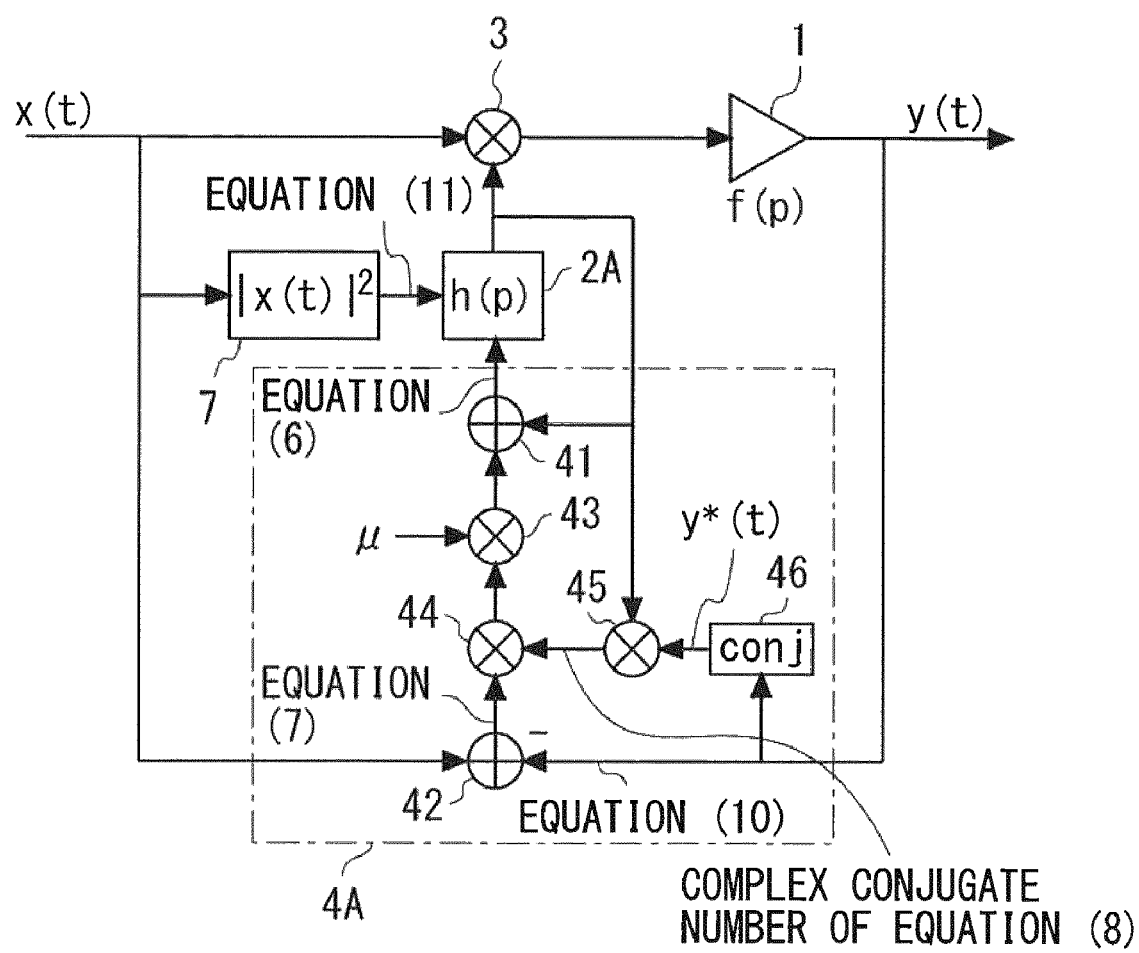
FIG. 7 illustrates digital predistortion in the burst distortion correction control apparatus according to the third embodiment of the present invention.

First, referring to FIG. 7, the DPD for compensating for a nonlinear distortion in the transmission amplifier 1 will be described. In the DPD, a distortion compensation coefficient is obtained according to the power or the amplitude of an input signal x(t) of a transmission target, and a result of multiplying the input signal x(t) by this distortion compensation coefficient is input to the transmission amplifier 1, thereby compensating for the nonlinear distortion in the transmission amplifier 1.

For estimation of a distortion compensation coefficient h(p), an adaptive algorithm is used. For the adaptive algorithm, an LMS algorithm is used in which the input signal x(t) is compared with an output signal y(t) of the transmission amplifier 1 having a nonlinear distortion added thereto and a coefficient is obtained so that an average square error can be minimum.

Estimation of a nonlinear distortion amount to be compensated for is performed by calculation of Expression 2 including Equations (6) to (11).

[Expression 2]

$$h_n(p) = h_{n-1}(p) + \mu e(t) u^*(t) \quad (6)$$

$$e(t) = x(t) - y(t) \quad (7)$$

$$u(t) = x(t) f(p) \cong h^*_{n-1}(p) y(t) \quad (8)$$

$$\because h_{n-1}(p) h^*_{n-1}(p) \cong 1 \quad (9)$$

$$y(t) = h_{n-1}(p) x(t) f(p) \quad (10)$$

$$p = |x(t)|^2 \quad (11)$$

In Expression 2, x(t) denotes an input signal (baseband signal), y(t) denotes an output signal of the amplifier 1, f(p) denotes a nonlinear distortion function of the amplifier 1, h(p) denotes an estimated distortion compensation coefficient to be updated, and μ denotes a step size parameter. In Expression 1, x, y, f, h, u, and e denote complex numbers, and * denotes a complex conjugate number. Assuming $h_{n-1}(p) h^*_{n-1}(p) \cong 1$ where amplitude distortion of nonlinear distortion of the amplifier 1 is not so large, u(t) is approximated.

In Equation (1), $h_n(p)$ denotes an updated distortion compensation coefficient of a nonlinear distortion, and an input to the holding unit 2A storing distortion compensation coefficients. For a branch signal y(t) corresponding to the output signal y(t) of the transmission amplifier 1, complex conjugation is taken by the complex number conversion circuit 46 that generates a complex conjugate number to obtain y*(t). A distortion compensation coefficient of the last time (one point back in time) $h_{n-1}(p)$ is multiplied by y*(t) by the multiplier 45 to obtain u*(t).

Then, an output e(t) of the comparator (subtracter) 42 is multiplied with u*(t) by the multiplier 44, and further multiplied with a step size parameter by the multiplier 43. An output of the multiplier 43 and the distortion compensation coefficient of one point back in time $h_{n-1}(p)$ are added together by the adder 41 to obtain a new distortion compensation coefficient $h_n(p)$ of nonlinear distortion.

Equation (11) means that the calculation circuit 7 is a circuit for obtaining a size of the power of an input signal x(t). In a case where the calculation circuit 7 is a circuit for obtaining an amplitude of the input signal x(t), Equation (11) is represented by |x(t)|. A value obtained by the calculation circuit 7 serves as an address for writing and reading with respect to the holding unit 2A storing distortion compensation coefficients.

The burst distortion correction control apparatus of the third embodiment performs the processing of the second embodiment described above to compensate for a burst distortion in the transmission amplifier 1. As a result, a distortion compensation coefficient (distortion correction coefficient) is obtained two dimensionally, which enables simultaneous compensation for a burst distortion and a nonlinear distortion in the transmission amplifier 1.

Fourth Embodiment

Figure 8:
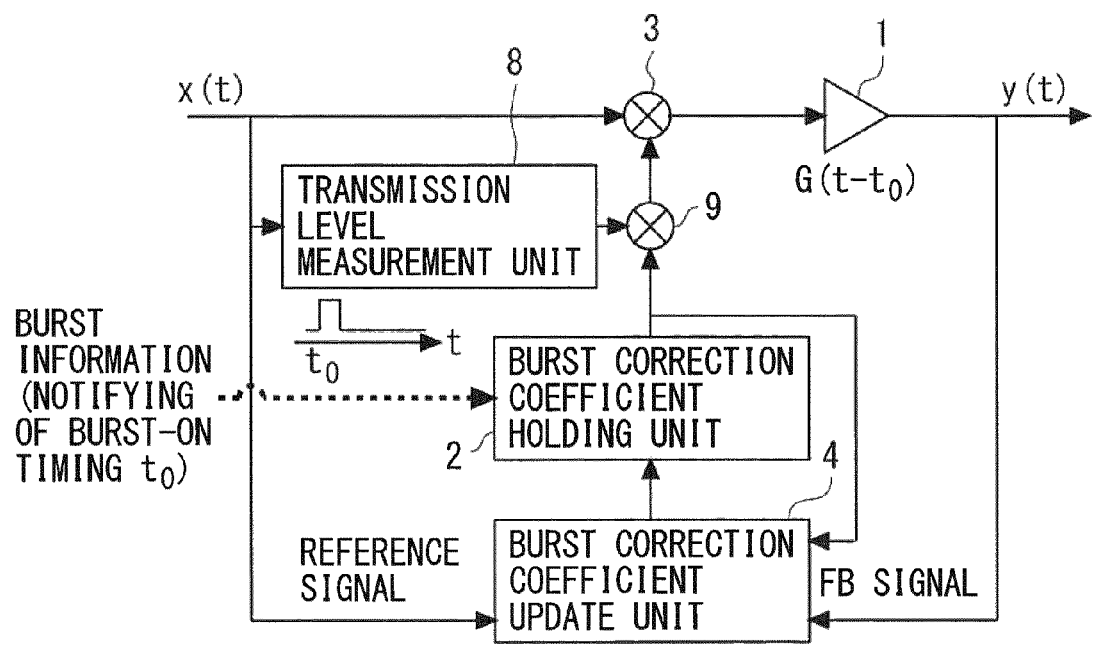
FIG. 8 is a block diagram illustrating a burst distortion correction control apparatus according to a fourth embodiment of the present invention.

FIG. 8 illustrates a configuration of a burst distortion correction control apparatus according to a fourth embodiment of the present invention. The fourth embodiment is further another modified example of the basic configuration of the first embodiment shown in FIG. 2.

The burst distortion correction control apparatus of the fourth embodiment employs a configuration where the burst distortion correction coefficient generated in the basic configuration of the first embodiment described above is adjusted according to an average size (amplitude) of input signals x(t) of transmission targets. Thus, the burst distortion correction control apparatus further includes a transmission level measurement unit 8 for obtaining an average size of input signals x(t).

Specifically, the transmission level measurement unit 8 obtains an average power of the input signals x(t). A burst distortion correction coefficient is read out from a burst correction coefficient holding unit 2 upon reception of a signal (burst signal) notifying of burst-ON timing. The burst distortion correction coefficient thus read out is multiplied by the average power obtained by the transmission level measurement unit 8, via a multiplier 9. A result of this multiplying is multiplied as reverse characteristics of burst distortion by the input signal x(t), by a multiplier 3.

Accordingly, adjustment (control) is performed to prevent a change in size of a burst correction coefficient following an instantaneous change (for each sampling point).

Other components and an operation of the burst distortion correction control apparatus of the fourth embodiment are similar to those of the burst distortion correction control apparatus of the first embodiment described above.

Effects of Embodiments

According to the burst distortion correction control apparatus of each embodiment, in the transmission amplifier 1 where nonlinear distortion occurs, an adjacent channel leakage power ratio (ACLR) deteriorated by the influence of the burst distortion generated when a signal is burst-transmitted may be rectified.

According to the burst distortion correction control apparatus of each embodiment, to correct an amplifier distortion (burst distortion) caused by burst transmission, reverse characteristics are given to an input signal to correct the distortion, and a correction coefficient is adaptively updated by an adaptive algorithm. Thus, an optimal correction coefficient may be maintained even when amplifier characteristics undergo change due to a temperature or a passage of time/years.

According to the burst distortion correction control apparatus of each embodiment, a burst distortion may be corrected without deforming a waveform of an amplifier output signal by ramp processing or the like.

Modification Example

The burst distortion correction of each embodiment may be applied to any situation such as when power is supplied, where the presence and absence of an input signal may be switched. A burst distortion correction coefficient may be generated highly accurately and fast by using an adjustment rectangular wave signal as an input signal.

The processing of each embodiment described above is provided as a computer-executable program, and may be provided via a recording medium such as a CD-ROM or a flexible disk, and via a communication line.

A plurality of optional processing operations or all of the embodiments may be selectively combined to be implemented.

What is claimed is:

1. A distortion correction control apparatus for compensating for a burst distortion in a transmission amplifier caused by a burst of an input signal of a transmission target, comprising:
    a holding unit that stores a distortion correction coefficient having reverse characteristics to the burst distortion;
    a unit that multiplies the distortion correction coefficient read out from the holding unit by the input signal or adds the distortion correction coefficient read out from the holding unit to the input signal, upon reception of burst information notifying of switching between presence and absence of the input signal; and
    an update unit that updates, based on the input signal, the distortion correction coefficient of the last time, and a signal fed back as an output signal of the transmission amplifier, the distortion correction coefficient by an adaptive algorithm, and that inputs the updated distortion correction coefficient to the holding unit.

2. The distortion correction control apparatus according to claim 1, wherein the adaptive algorithm includes an LMS minimum square method.

3. The distortion correction control apparatus according to claim 1, wherein the distortion correction coefficient read out from the holding unit to be multiplied by the input signal of the transmission target or added to the input signal of the transmission target is a correction coefficient according to a passage of time from switching between presence and absence of the input signal.

4. The distortion correction control apparatus according to claim 1, further comprising a unit that performs digital predistortion to compensate for a nonlinear distortion in the transmission amplifier.

5. The distortion correction control apparatus according to claim 1, further comprising a unit that obtains average power of the input signal to adjust the distortion correction coefficient according to an average size of the input signal.

6. A distortion correction control method for compensating for a burst distortion in a transmission amplifier caused by a burst of an input signal of a transmission target, comprising:
    storing, in a holding unit, a distortion correction coefficient having reverse characteristics of the burst distortion;
    multiplying the distortion correction coefficient read out from the holding unit by the input signal or adding the distortion correction coefficient read out from the holding unit to the input signal, upon reception of burst information notifying of switching between presence and absence of the input signal; and
    updating, based on the input signal, the distortion correction coefficient of the last time, and a signal fed back as an output signal of the transmission amplifier, the distortion correction coefficient by an adaptive algorithm, and inputting the updated distortion correction coefficient to the holding unit.

7. The distortion correction control method according to claim 6, wherein the adaptive algorithm includes an LMS minimum square method.

8. The distortion correction control method according to claim 6, wherein the distortion correction coefficient read out from the holding unit to be multiplied by the input signal of the transmission target or added to the input signal of the transmission target is a correction coefficient according to a passage of time from switching between presence and absence of the input signal.

9. The distortion correction control method according to claim 6, further comprising performing digital predistortion to compensate for a nonlinear distortion in the transmission amplifier.

10. The distortion correction control method according to claim 6, further comprising obtaining average power of the input signal to adjust the distortion correction coefficient according to an average size of the input signal.

* * * * *